(12) United States Patent
Lu et al.

(10) Patent No.: US 7,226,812 B2
(45) Date of Patent: Jun. 5, 2007

(54) WAFER SUPPORT AND RELEASE IN WAFER PROCESSING

(75) Inventors: Daoqiang Lu, Chandler, AZ (US);
Steven Towle, deceased, late of Sunnyvale, CA (US); by Anna M. George, legal representative, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 368 days.

(21) Appl. No.: 10/816,234

(22) Filed: Mar. 31, 2004

(65) Prior Publication Data

US 2005/0221598 A1    Oct. 6, 2005

(51) Int. Cl.
*H01L 21/00* (2006.01)
(52) U.S. Cl. .................. 438/114; 438/464; 438/465; 257/E21.502; 257/E23.119
(58) Field of Classification Search ............... 438/114, 438/464, 465; 257/E21.502, E23.703
See application file for complete search history.

(56) References Cited

U.S. PATENT DOCUMENTS

2006/0051935 A1\* 3/2006 Silverbrook ................ 438/458

OTHER PUBLICATIONS

AI Technology, Dicing and Lapping Tapes for Wafer and Substrate. Product-line Overview. Copyright 2001 A.I. Technology, Inc. Last modified Sep. 18, 2001. pp. 1-2.
ASI Adhesives & Sealants Industry, UV/EB-Curable Acrylate Silicones for Release Coatings. Posted on May 29, 2002. pp. 1-6.
Lamination Process UV Release Films. Lamination Process for UV Releasing Dicing Tape to Wafer-Substrate. p. 1-2.
Polymer Bulletin, Concentration effects of methylalumoxane, palladium and nickel pre-catalyst and monomer in the vinyl polymerization of norbornene by Christoph Janiak and Paul-Gerhard Lassahn. Feb. 27, 2001.
IZM, New Process Scheme for Wafer Thinning and Stress-free Separation of Ultra Thin ICs by C. Landesberger, et al. Microsystems Techonologies 2001. pp. 431-436.
Institute of Physics Publishing, Sacrificial polymers for nanofluidic channels in biological applications by Wanli Li, et al. Published Apr. 14, 2003.

\* cited by examiner

*Primary Examiner*—Fernando L. Toledo
(74) *Attorney, Agent, or Firm*—Blakely, Sokoloff, Taylor & Zafman LLP

(57) ABSTRACT

Methods and apparatuses for wafer support and release using sacrificial materials in wafer processing. In one embodiment, a solution of a sacrificial polymer is spray-coated on the wafer bump side to form a thin layer of the sacrificial polymer after solvent vaporization. An adhesive layer is then used to attach the wafer bump side onto a wafer support substrate over the sacrificial polymer to support the wafer in backside processing. After wafer thinning and backside metal deposition, the wafer is exposed to heat to thermally decompose the sacrificial polymer into gases. The decomposition of the sacrificial polymer reduces the adhesion of the adhesive layer to the bump side of the wafer such that, when the support substrate is detached from the wafer, the adhesive layer is detached together with the support substrate from the wafer bump side, leaving almost no residual traces.

26 Claims, 13 Drawing Sheets

WAFER SUPPORT AND RELEASE IN WAFER PROCESSING

FIELD

At least some embodiments of the invention relate to wafer processing, and more specifically, to releasing of temporary bonding in wafer processing.

BACKGROUND

Adhesive tapes and adhesive materials, such as epoxy, acrylics, cyanate ester, have been used for temporary bonding in wafer processing. During wafer processing, a wafer may be temporarily bonded to a support substrate and later released from bonding to the support substrate after certain processing operations. For example, a wafer may be temporarily bonded to a glass substrate for support during the grinding of the backside of the wafer before backside metal (BSM) deposition. Backside grind may be performed to thin the wafer and aid sawing the wafer into chips for packaging and/or to rough the backside surface for improved adhesion of backside metal, such as Gold. After the backside grind and backside metal deposition, the support substrate is detached from the wafer.

There exist commercially available adhesive tapes with the capability of ultraviolet (UV) light activated release of temporary bonding. The adhesion of the UV-releasing tapes reduces greatly after the exposure to the UV light. Such tapes may be used as wafer dicing tapes, providing temporary bonding of the wafer to the wafer dicing frame under the temperature of 80° C. or less in the absence of the UV light.

BRIEF DESCRIPTION OF THE DRAWINGS

The accompanying drawings illustrate by way of example and not limitation, in which like references indicate similar elements.

DETAILED DESCRIPTION

Figure 1:
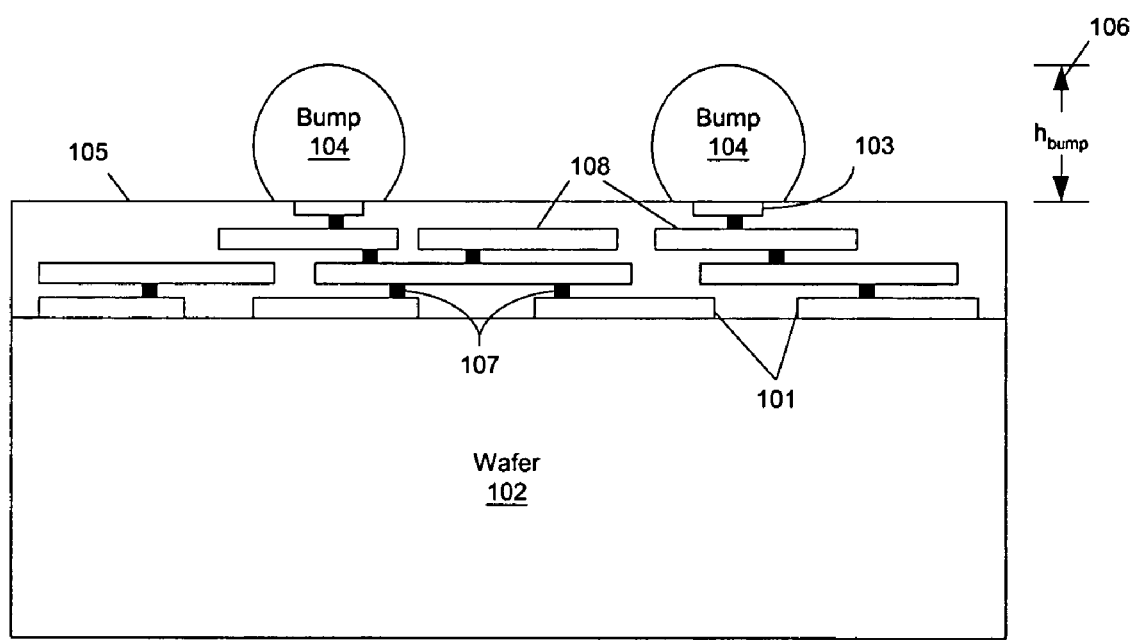
FIGS. 1–10 illustrate an example process of using a sacrificial material to form temporary bonding and for subsequent release during wafer processing according to one embodiment of the invention.

In the following description, numerous specific details are set forth. However, it is understood that embodiments of the invention may be practiced without these specific details. In other instances, well-known circuits, structures and techniques have not been shown in detail in order to avoid obscuring the understanding of the disclosure. References to one or an embodiment in the present disclosure are not necessarily references to the same embodiment; and, such references mean at least one.

In one embodiment of the present invention, a solution of a sacrificial polymer (e.g., Unity™ Sacrificial Polymer from BFGoodrich) is spray-coated on the wafer bump side. After solvent vaporization, a very thin layer of the sacrificial polymer is deposited on the wafer bump side. A liquid adhesive or a double-side tape is used to attach the wafer onto a wafer support substrate. After wafer thinning and backside metal deposition, the wafer with wafer support substrate is exposed to heat to decompose the sacrificial layer. The sacrificial polymer decomposes into gases and leaves almost no residues. Then, the wafer with the wafer support substrate is mounted on a wafer dicing frame; and the wafer support substrate is detached using a vacuum chuck. Since the sacrificial layer decomposes completely into gases, the adhesion between the wafer bump side and the adhesive layer is greatly reduced. Thus, the wafer support substrate and the adhesive layer can be detached easily from the wafer. Since the sacrificial layer decomposes almost completely into gases, minimum residues are left on the wafer bumps. Further details and alternative embodiments are described below.

A support glass substrate can be temporarily bonded to the front side of the wafer to support and protect the wafer during backside grind. A double side tape or an adhesive material can be used to form an adhesive layer for temporary bonding. The front side of the wafer may have bumps, pads, or other extruding structures, which may further increase the adhesion of the adhesive layer to the front side of the wafer. However, releasing of the support substrate from the wafer can be very difficult because of the strong adhesion of the adhesive layer to the front side of the wafer. After the backside grind, the adhesive layer may stick to the front side of the wafer when the support substrate is detached from the wafer. Peeling off the adhesive layer manually can be tedious, slow and costly.

At least one embodiment of the invention uses a sacrificial material to reduce the adhesion of the adhesive layer to the contact side of the wafer during the releasing of the temporary bonding. Thus, for example, the adhesive layer can be easily detached together with the support substrate from the wafer after wafer thinning.

Sacrificial polymer materials, such as Polynorbornene, Polyoxymethylene and Polycarbonate, decompose at certain temperatures into gaseous species, leaving almost no residues. For example, a family of thermal decomposable norbornene derivatives, known as Unity™ Sacrificial Polymers, commercially available from Promerus LLC (formerly BFGoodrich Performance Materials), Brecksville, Ohio, USA, can be dissolved in a solvent (e.g., 1,3,5-trimethylbenzene). The decomposition temperature of the sacrificial polymer materials can be tailored by changing the chemical structure. For example, sacrificial polymer materials with a decomposition temperature around 200° C.–250° C. are available. Such a decomposition temperature allows a secure bonding during the processing of the wafer (e.g., during the backside grind and backside metal deposition), while causing no damage to the wafer during the thermal decomposition of the materials.

In one embodiment of the invention, a solution of a sacrificial polymer is spray-coated on the wafer bump side. After solvent vaporization, a very thin layer (e.g., a couple of microns thick or less) of the sacrificial polymer is deposited on the wafer bump side. An adhesive layer formed from a double-sided tape or a liquid adhesive is then used to attach the wafer onto a wafer support substrate. After wafer thinning and backside metal deposition, the wafer is exposed to heat with the wafer support substrate to thermally decompose the sacrificial polymer. The decomposition of the sacrificial polymer reduces the adhesion of the adhesive layer to the bump side of the wafer. The wafer is then mounted on the wafer dicing frame on the backside of the wafer, with the support substrate attached to the bump side of the wafer. The support substrate is then detached from the wafer using a vacuum chuck. Since the sacrificial material decomposed into gaseous species during the heating process, the adhesion between the wafer bump side and the adhesive layer is smaller than the adhesion between the support substrate and the adhesive layer. Thus, the adhesive layer is detached together with the support substrate from the bump side of the wafer. Further, since the adhesion of the adhesive layer to the bump side of the wafer is greatly reduced, detaching of the support substrate can be performed easily with a smaller force than that required without the use of the sacrificial polymer (or before the decomposition of the sacrificial polymer). Since the layer of sacrificial polymer is very thin, it can easily decompose into gases completely in heat without leaving residues on the wafer bumps. More detailed examples are described below.

FIGS. 1–10 illustrate an example process of using a sacrificial material to form temporary bonding and for subsequent release during wafer processing according to one embodiment of the invention.

FIG. 1 shows a wafer (102) with contacts (e.g., bumps 104) on the front side. For example, a large silicon single crystal cylinder is typically sliced into thin wafers, which are used for making Integrated Circuit (IC) chips. Devices (e.g., circuits) are typically formed near the front side of the wafer. When a wafer is completed through the fabrication process, the front side surface of the wafer typically contains many individual discrete devices (dies or chips, as illustrated in FIG. 10). The contacts (e.g., bond pads, solder bumps) provide the electrical connections between the die substrate (e.g., from the circuits formed in the wafer) and the pins of the packaged IC chip for connection onto a printed circuit board. For example, a device formed on the wafer includes cells for implementing logic gates (e.g., 101) and metal layers (e.g., 108) for electronically interconnect the cells. Dielectric layers (e.g., 105) separate metal layers from cells and bumps. Bumps 104 provide electronic connections to the device through pads (e.g., 103), metal layers (e.g., 108) and vias (e.g., 107). It is understood that in FIGS. 1–10 only a section of the wafer is illustrated; and an entire wafer typically includes a large number of bumps on the bump side for many discrete devices.

The height of the bumps, $h_{bump}$ (106), is typically in the order of 50 micron. Alternatively, other structures extruding above a surface of the wafer, such as bond pads, may present on the front side of the wafer (e.g., for providing electrical contacts for the devices formed on the wafer).

Figure 2:
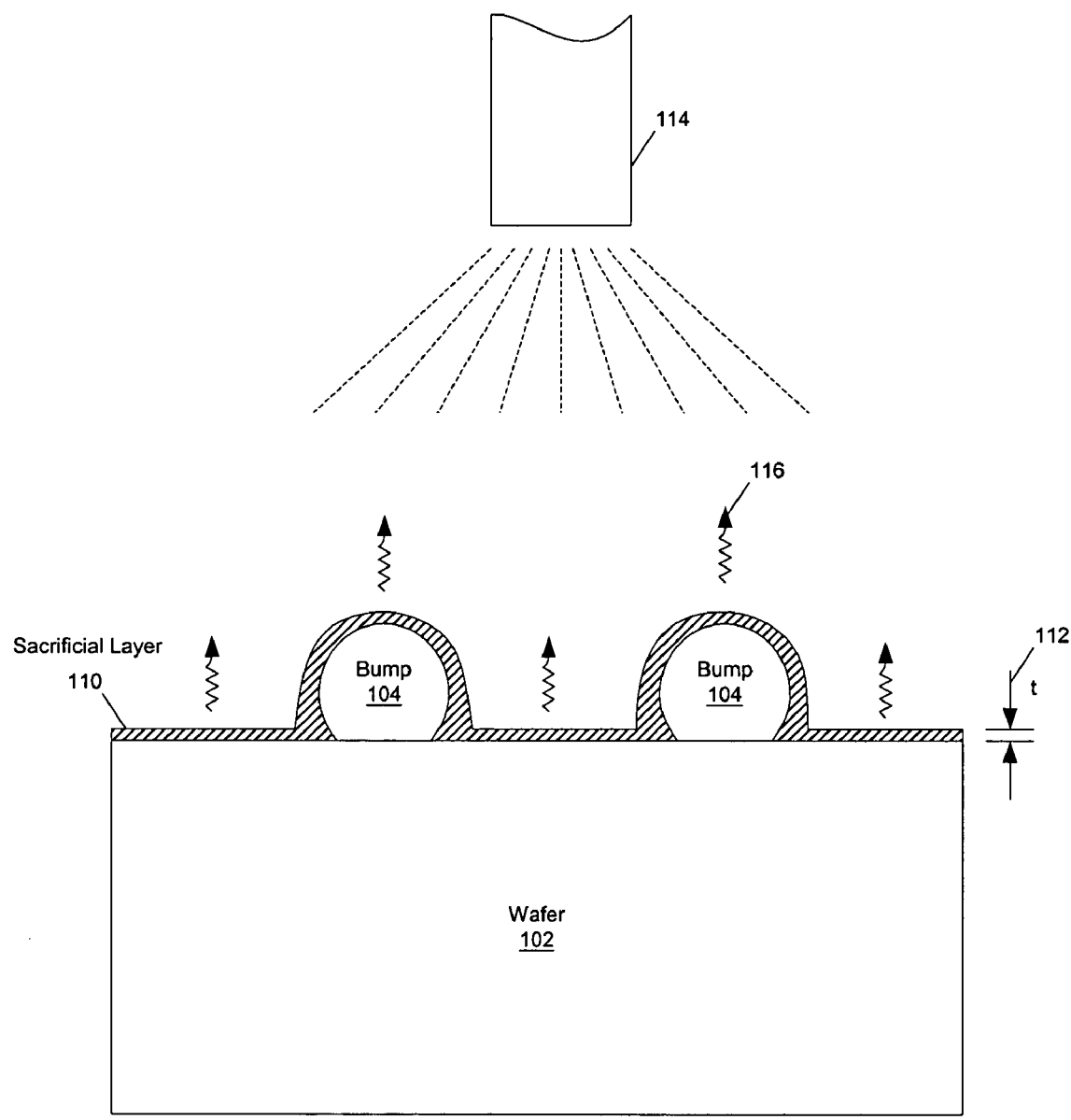

FIG. 2 shows a sacrificial layer (110) formed on the bump side of the wafer. The thickness, t (112), of the sacrificial layer can be in a range of a few microns, or less than one micron.

The sacrificial layer may be formed through spray coating (114) a solution of a sacrificial polymer on the wafer bump side. Alternatively, the solution may be spin coated on the wafer bump side. After solvent vaporization (116), the thin layer of the sacrificial polymer is coated on the bump side of the wafer. For example, a solution of a Unity™ Sacrificial Polymer in a solvent (e.g., trimethylbenzene) can be spray coated on the wafer bump side. After the solution of the sacrificial polymer is cured (e.g., through vaporizing the solvent), a layer of the sacrificial polymer is deposited on the bump side of the wafer. In one embodiment, the sacrificial polymer coated on the bump side of the wafer has a decomposition temperature (e.g., in the range of 200° C.–250° C.) that is higher than the temperatures the wafer experiences during the processing under the support of the wafer support substrate bonded temporary to the bump side of the wafer through an adhesive layer (e.g., wafer thinning and backside metal deposition) but lower than the temperatures that would cause degradation of the adhesive layer or other structures (e.g., the solder bumps). The solvent, the sacrificial polymer and gases generated from decomposing the sacrificial polymer do not react with the wafer and the structures formed above the surface of the wafer (e.g., bumps, pads). Thus, the application of the sacrificial polymer will not cause damage to the devices formed on the wafer. Since the sacrificial polymer decomposes into gases when heated to the decomposition temperature, leaving minimum residuals on the bump side of the wafer, the sacrificial polymer can be destructed through heating to reduce the adhesion between the adhesive layer and the wafer bump side so that the adhesive layer can be easily removed together with the wafer support substrate from the wafer.

The sacrificial layer may or may not continuously cover the entire bump side. In one embodiment, the sacrificial material is substantially uniformly distributed on the bump side so that upon the decomposition of the sacrificial material the adhesion of the adhesive layer is reduced substantially uniformly on the bump side. However, depending on the surface condition of the bump side of the wafer, the distribution of the sacrificial material may not be uniform. For example, a distribution of the sacrificial material may be denser in an area with more extruding structures than in other areas. The distribution of the sacrificial material can be used to control the degree of reduction in adhesion in the releasing process.

Since when trapped the gases generated after the decomposition of the sacrificial polymer may apply an expanding force on the wafer, in one embodiment, only a thin layer of the sacrificial layer is coated so that no excessive force is applied on the wafer to cause damage or cause rapid separation of the wafer and the support substrate when heated.

Figure 3:
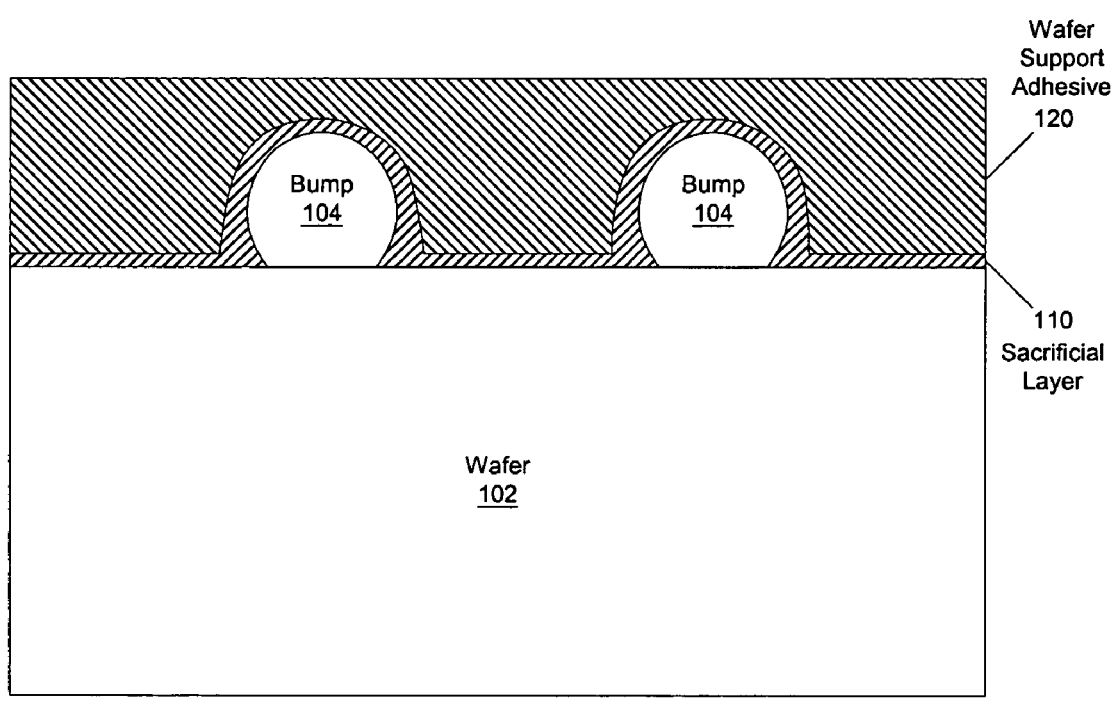

In FIG. 3, a wafer support adhesive (120) is applied over the sacrificial layer (110). The wafer support adhesive may be formed using a liquid adhesive, such as acrylics which is UV-curable at a room temperature. Other types of adhesives, such as epoxy or cyanate ester, can also be used. The liquid adhesive can be spin coated over the sacrificial layer on the bump side. Alternatively, a double side coated adhesive tape may be used as the wafer support adhesive.

In one embodiment, the sacrificial layer does not continuously cover the entire bump side of the wafer. Thus, the wafer support adhesive may bond to the sacrificial layer in some areas and directly bond to wafer in some other areas.

The adhesive layer is typically thicker than the height of the structures extruding beyond the wafer surface (e.g., thicker than the bump height $h_{bump}$ (106) illustrated in FIG. 1). Thus, the bumps are protected in the wafer support adhesive layer; and the bumps do not directly contact the wafer support substrate.

In one embodiment, while the adhesive is still in the liquid form, a wafer support substrate is mounted on the adhesive layer so that the wafer support substrate and the adhesive layer are in smooth contact. The mounting of the wafer support substrate may be performed under vacuum condition to avoid trapping air bubbles. Then, the liquid adhesive is cured (e.g., through exposure to UV light at a room temperature) into a solid form, providing adhesive bonding between the wafer and the wafer support substrate.

Figure 4:
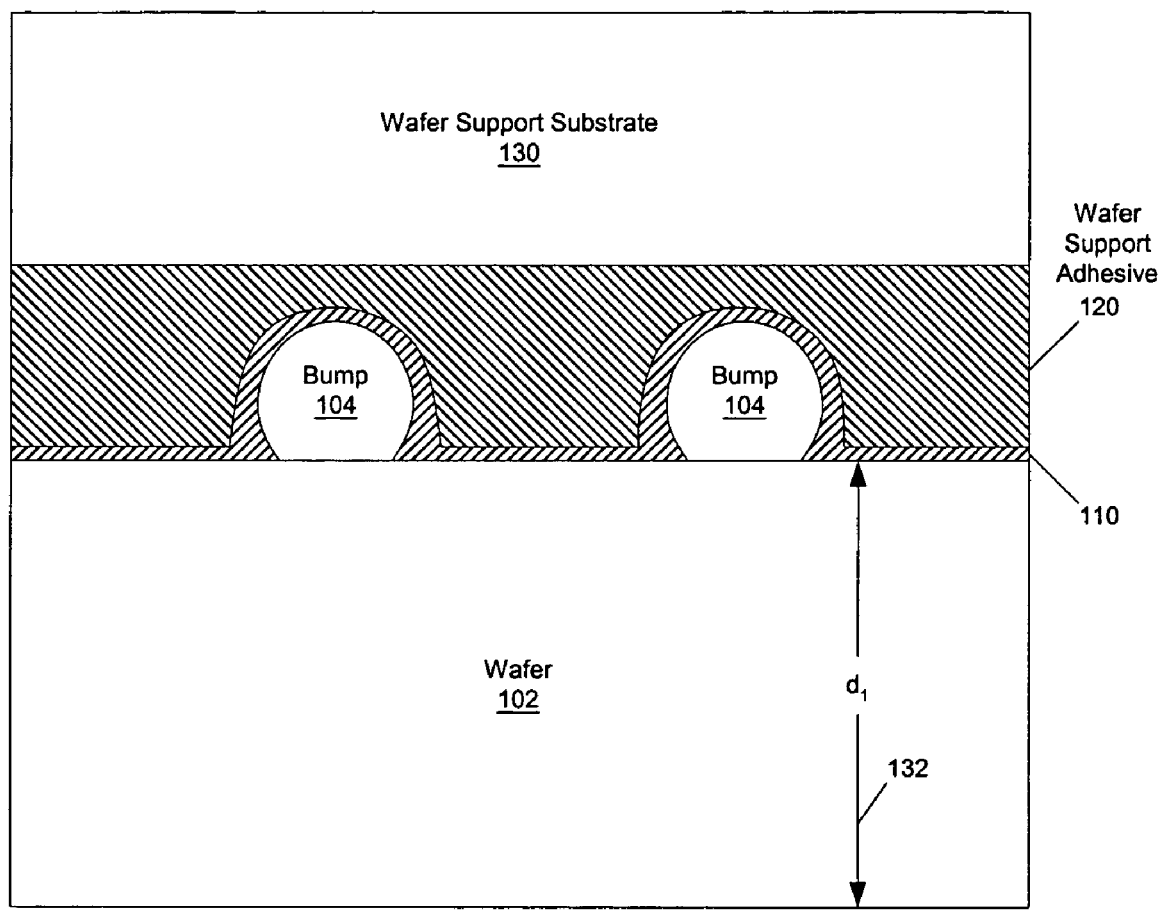

FIG. 4 shows the wafer (102) mounted on a wafer support substrate (130). In one embodiment, the wafer support substrate is made of clear glass (e.g., quartz glass). Thus, when a UV-curable liquid adhesive, such as acrylics, is used for the wafer support adhesive, UV-light can be shined through the wafer support substrate on the liquid adhesive to cure the adhesive layer and to bond the wafer to the wafer support substrate.

The wafer support substrate may be used to support the wafer during backside grind. The wafer support adhesive and the sacrificial layer secure the wafer to the wafer support substrate so that the bumps and the devices under the bumps are protected during backside grind. The thickness of the wafer support adhesive is typically larger than the height of the bumps to protect the bumps (and other extruding structures on the front side of wafer). Alternatively, a double side coated adhesive tape may be used to form the wafer support adhesive.

Figure 5:
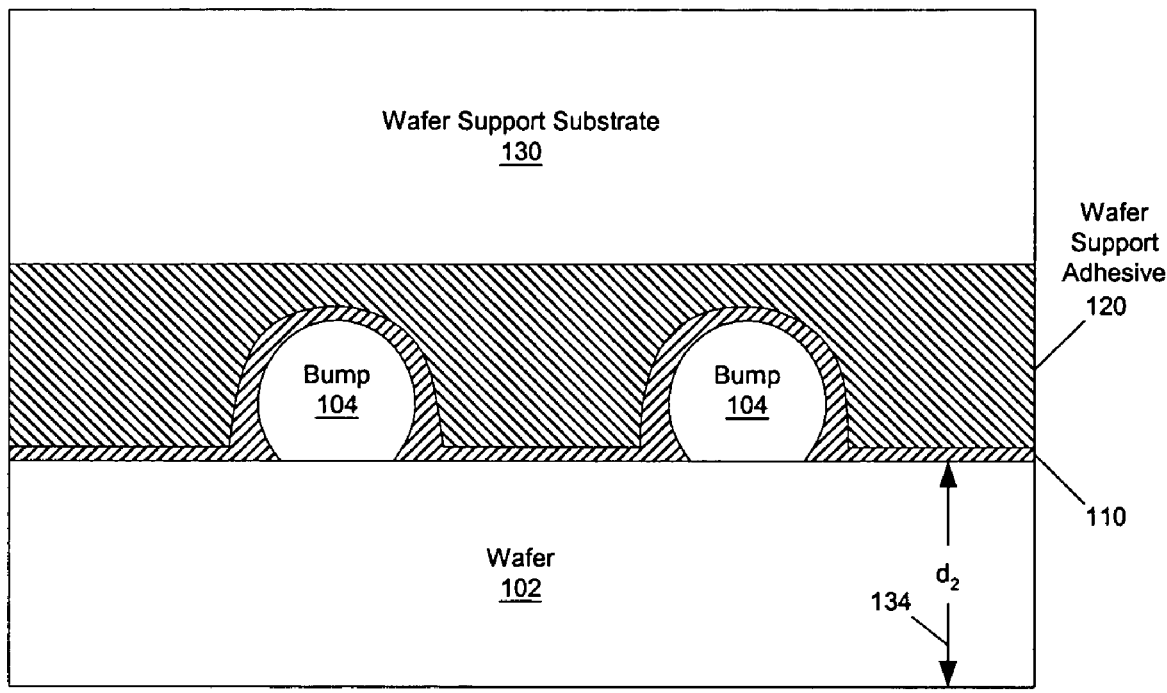

In one embodiment, the wafer is thinned significantly to reduce the thickness (e.g., to less than 150 microns). The wafer may be thinned significantly to accommodate packaging requirement (e.g., stack packaging) or to attach a heat sink. For example, a full thickness bumped wafer may be grinded on the backside using a diamond plate to reduce the thickness to less than 125 µm. FIG. 5 illustrates the wafer after thinning so that thickness $d_2$ (134) in FIG. 5 is much smaller than thickness $d_1$ (132) in FIG. 4. The heat generated from backside grind can be controlled through the use of cooling water so that the temperature of the wafer does not rise to degrade the bonding adhesion of the wafer support adhesive and the sacrificial layer.

Figure 6:
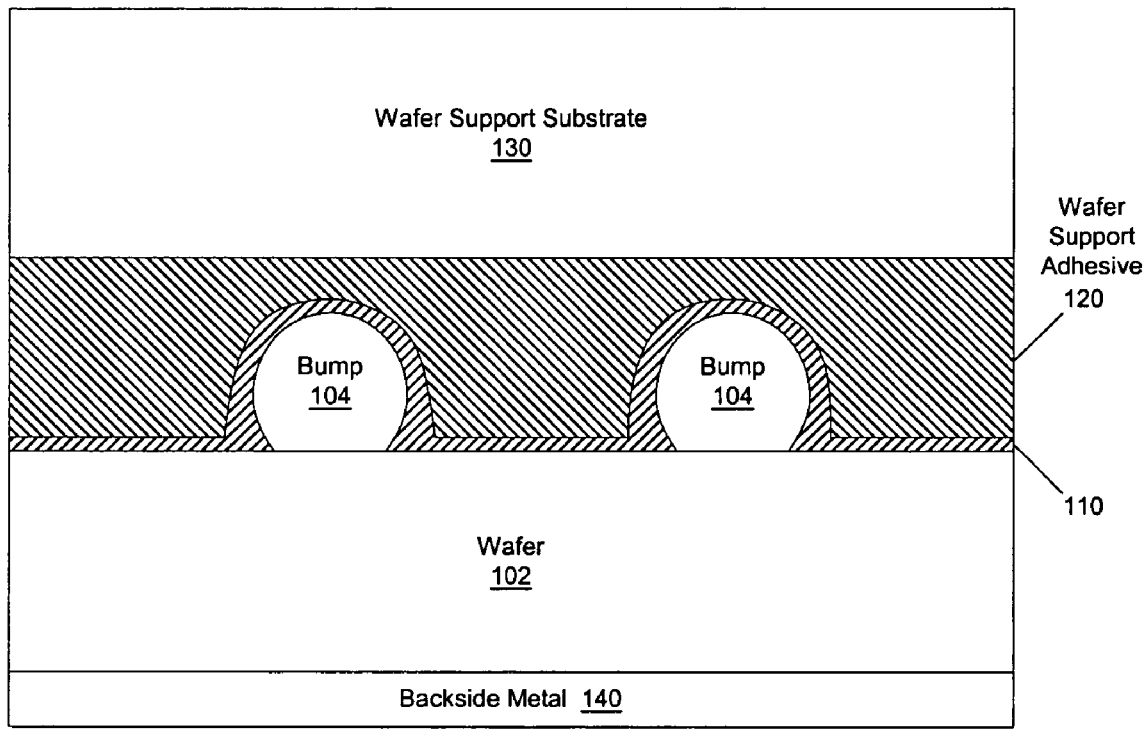

FIG. 6 shows the backside metal (140) deposited on the backside of the wafer after wafer thinning (or backside grind). The backside metal may include one or more layers of Au, Ni, Ti, Pt and others, according to the design and the application of the devices. For example, the backside metal may include one or more layers, such as an adhesion/barrier layer (e.g., Titanium or Tantalum), a wetting layer (e.g., Nickel, Nickel Vanadium), and protection layer (e.g., Gold or Platinum).

Figure 7:
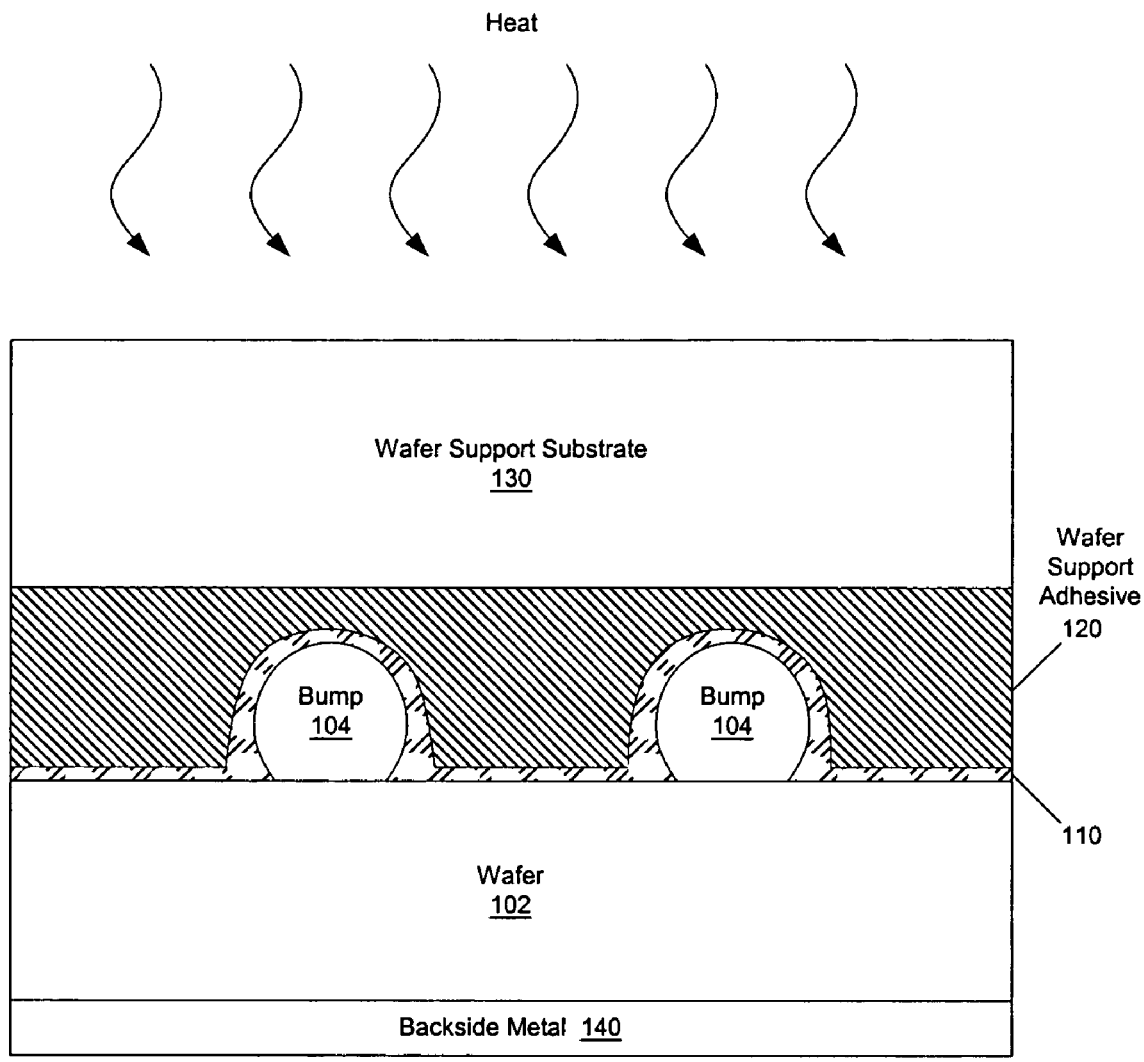
Figure 7:
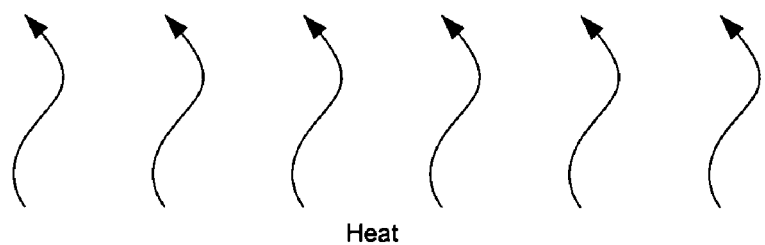

FIG. 7 illustrates the decomposition of the sacrificial layer when the wafer is exposed to heat. In one embodiment, the wafer may be heated in an oven at a temperature about 200° C.–250° C. for a period of 5 to 10 minutes. Exposed to heat, the sacrificial polymer decomposes into gases in the oven, forming voids at the interface between the wafer and the wafer support adhesive. The gases may be trapped between the wafer and the wafer support adhesive. In one embodiment, the thickness of the sacrificial layer is very thin such that the expansion force applied by the trapped gases does not rapidly destroy the bonding between the wafer and the wafer support adhesive. The decomposition and the expansion force of the gases generated from the decomposition greatly reduce the adhesion of the wafer support adhesive to the bump side of the wafer. The detaching of the wafer support substrate is performed in a controlled manner. In one embodiment, the wafer support adhesive still adheres to the bump side of the wafer after the decomposition of the sacrificial layer so that the wafer support substrate can provide support in the handling of the wafer before the wafer support substrate is detached from the wafer. Alternatively, the adhesion of the wafer support adhesive to the bump side of the wafer may be substantially reduced to zero; and the gases from the decomposition form a thin cushion between the wafer support adhesive and the bump side of the wafer.

In one embodiment, after the decomposition of the sacrificial layer, the wafer support substrate is not detached from the wafer until further processing (e.g., attaching the back side of the wafer to a supporting tape, such as a wafer dicing tape). Alternatively, the wafer may be detached from the wafer after the decomposition of the sacrificial layer and before further processing, since the decomposition of the sacrificial layer greatly reduces the adhesion of the adhesion layer to the wafer bump side.

Figure 8:
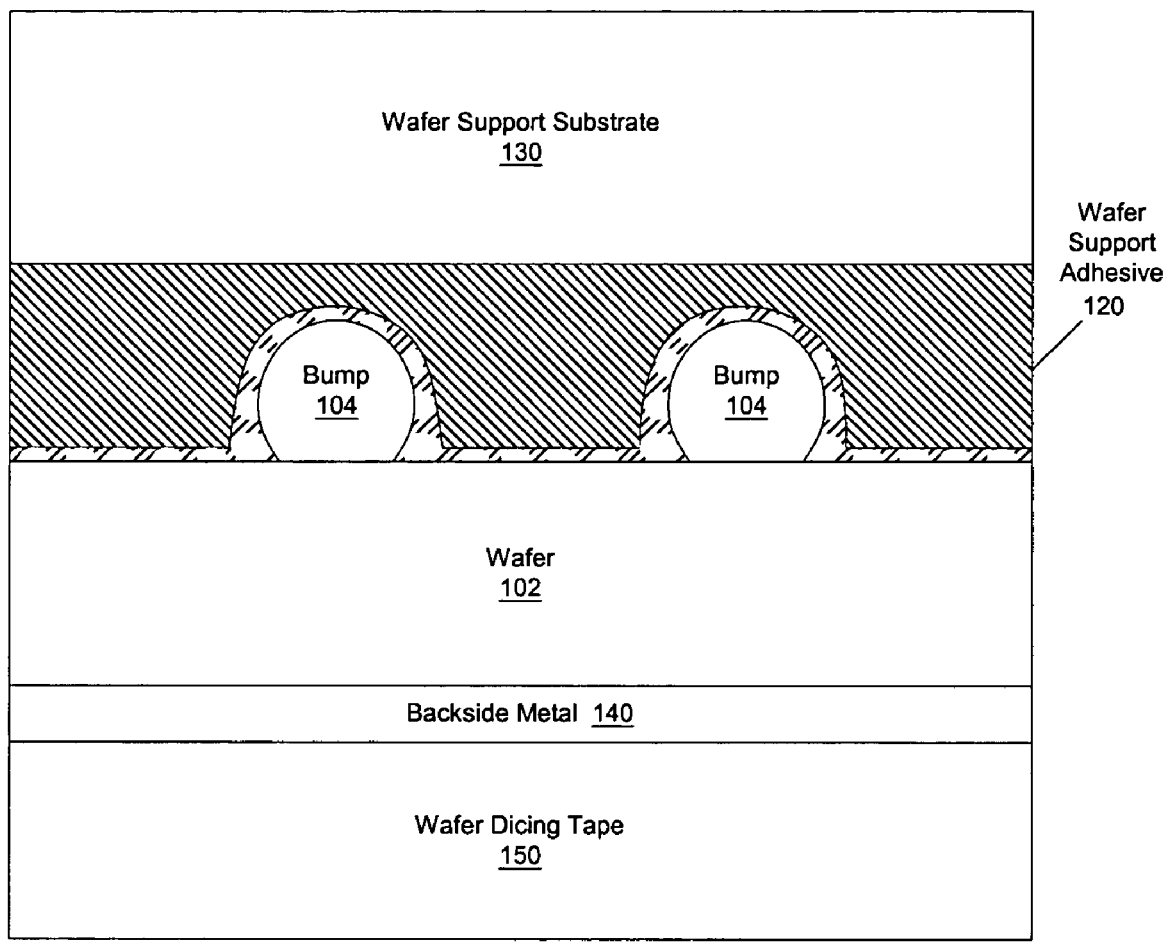

FIG. 8 shows attaching the wafer on the wafer dicing tape (e.g., to mount on a wafer dicing frame, not shown). Any commercially available wafer dicing tapes, such as a UV-releasing tape, can be used.

Figure 9:
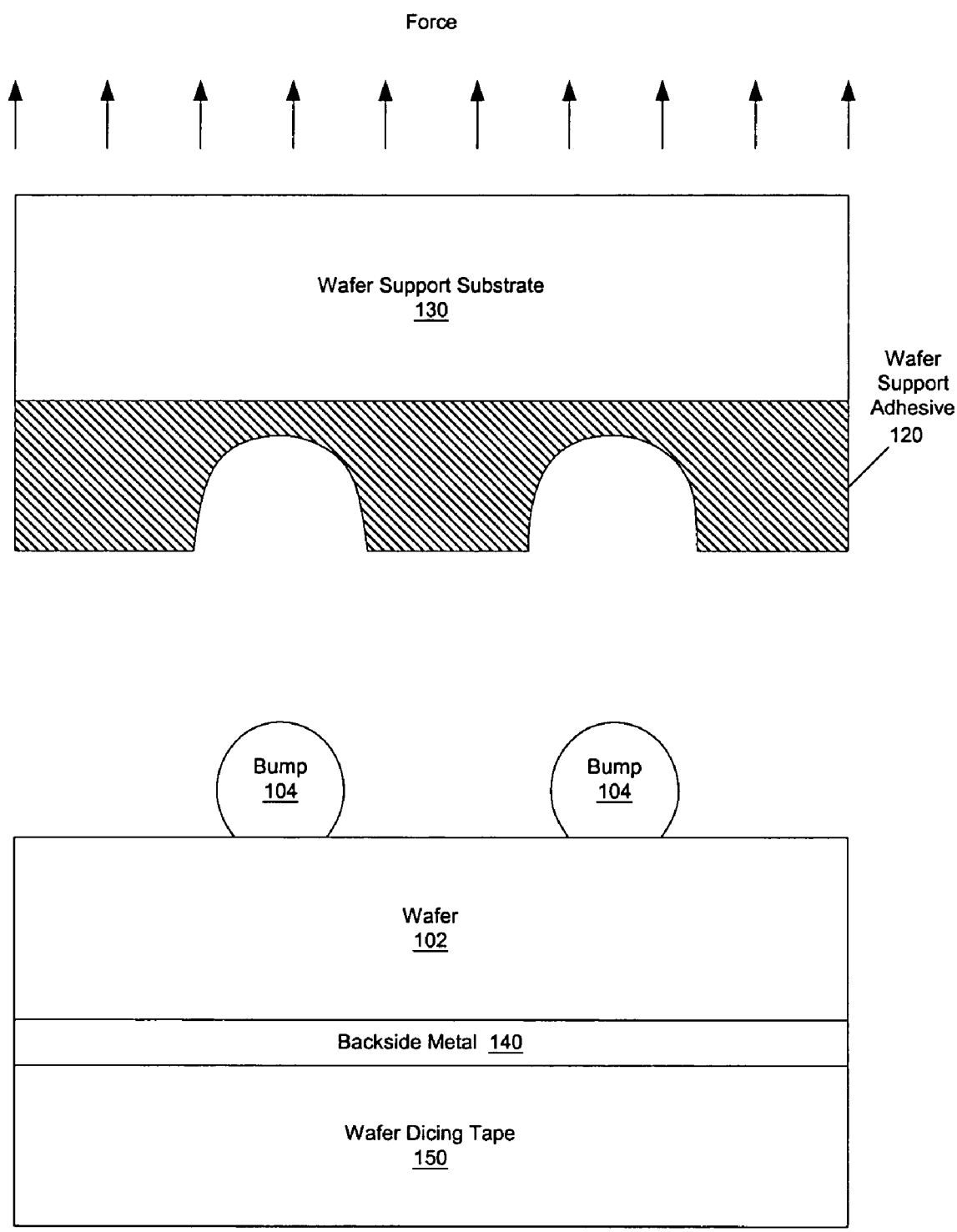
Figure 10:
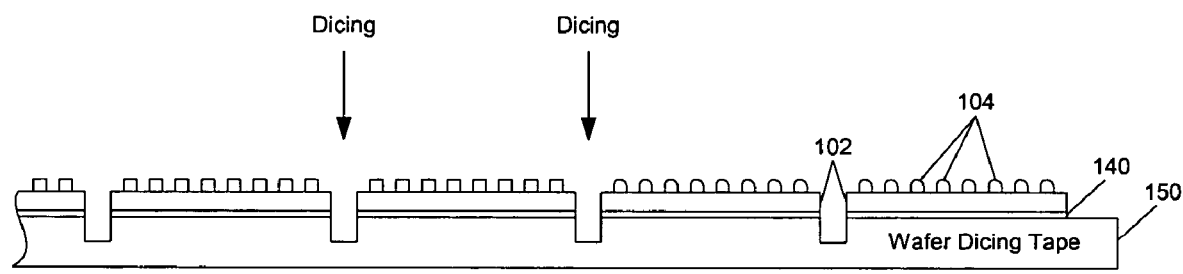

FIG. 9 shows detaching the wafer support substrate (130) together with the wafer support adhesive (120) from the bump side of the wafer. For example, a vacuum tool can be used to lift the wafer support substrate together with the wafer support adhesive off the bump side of the wafer while the wafer is attached to a wafer dicing frame using the wafer dicing tape. Since the adhesion of the wafer support adhesive to the bump side of the wafer is greatly reduce, only a small force is required to release the wafer support substrate from the wafer. Further, since the adhesion of the wafer support adhesive to the wafer support substrate remains strong, the wafer support adhesive adheres to the wafer support substrate, not the bump side of the wafer. Thus, the need to peel off the adhesive layer is eliminated.

The sacrificial layer is substantially decomposed into gases. Thus, after the release of the wafer from the wafer support substrate, the bump side of the wafer is substantially free of residue traces from the sacrificial layer and the wafer support adhesive.

Optionally, plasma cleaning can be performed to remove any possible residual traces on the wafer bumps (e.g., through performing plasma clean using argon).

After detaching the wafer support substrate (and optional plasma cleaning), the thin wafer can be diced into chips for packaging. FIG. 10 illustrates the dicing of the wafer into multiple individual discrete devices (dies or chips).

Figure 11:
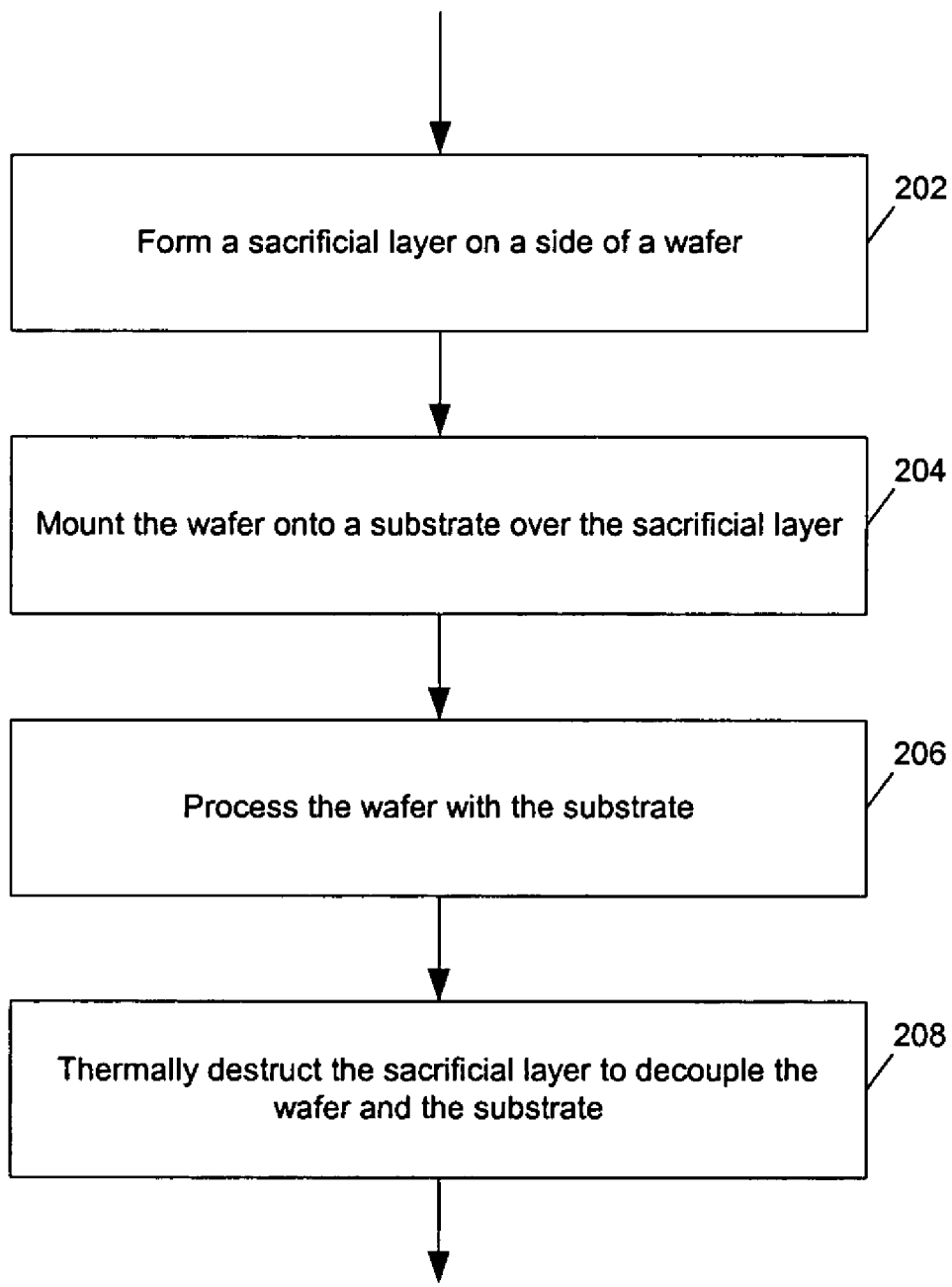
FIG. 11 shows a flowchart of a process to use a sacrificial material according to one embodiment of the invention.

FIG. 11 shows a flowchart of a process to use a sacrificial material according to one embodiment of the invention. After a sacrificial layer is formed on a side of a wafer (202), the wafer is mounted onto a substrate over the sacrificial layer (204). Then, the wafer is processed with the substrate (206). For example, the substrate may be used to support and protect the wafer during the backside grind process. The sacrificial layer is thermally destructed to decouple the wafer and the substrate (208). For example, the wafer and the substrate are exposed to heat to cause the decomposition of the sacrificial layer into gases. Alternatively, UV light or laser may be used to cause the thermal decomposition of the sacrificial layer. Although it is preferred to use a sacrificial material that thermally decomposes into gases without residual traces, other types of materials that degrade in bonding strength with a wafer under certain condition (e.g., upon exposure to UV light or heat) may also be used. It is preferred that no residual traces are generated from the sacrificial material after the detaching of the substrate to minimize the need for cleaning.

Figure 12:
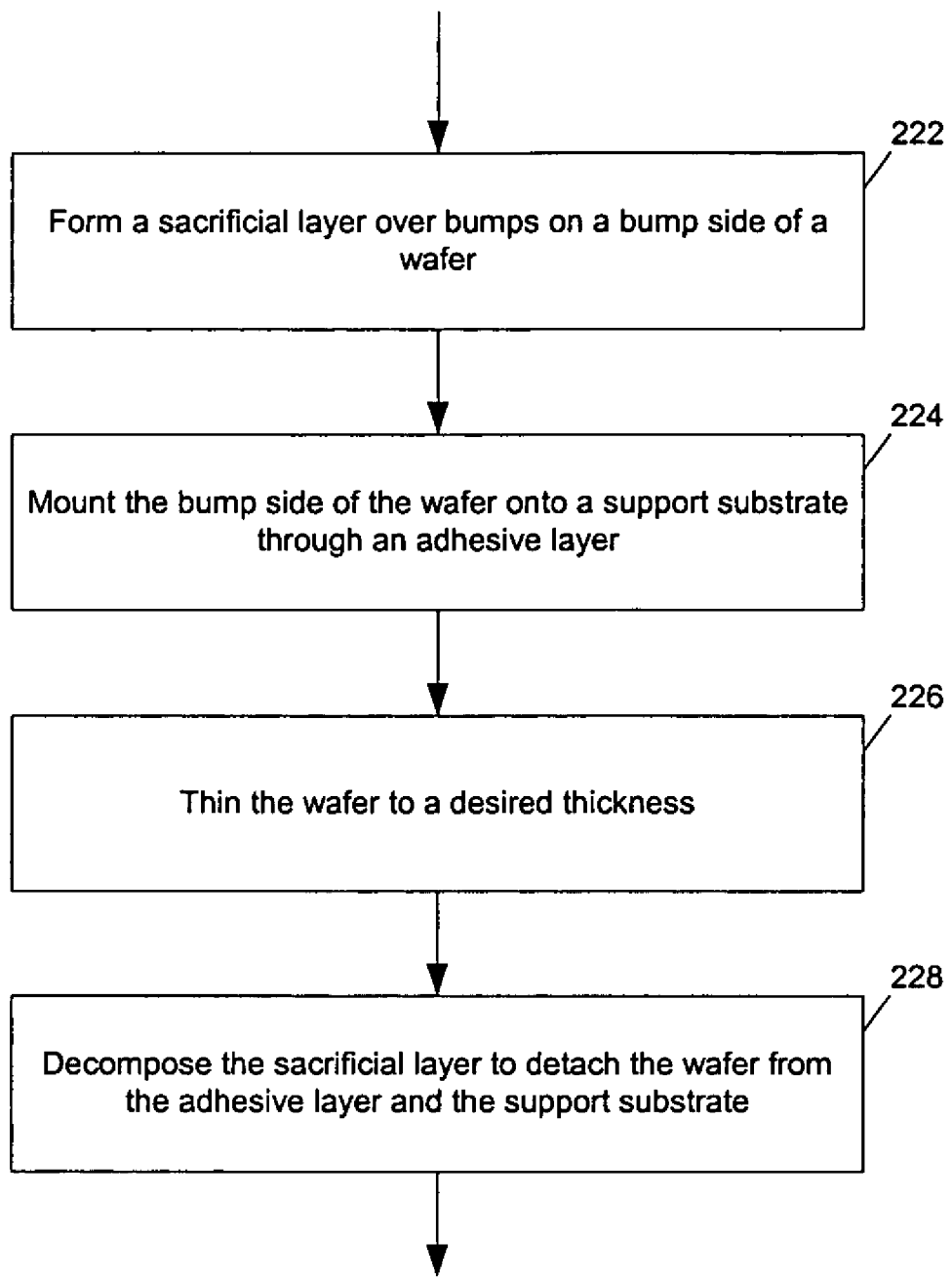
FIG. 12 shows a flowchart of a process for wafer thinning according to one embodiment of the invention.

FIG. 12 shows a flowchart of a process for wafer thinning according to one embodiment of the invention. After a sacrificial layer is formed over bumps on a bump side of a wafer (222), the bump side of the wafer is mounted onto a support substrate through an adhesive layer (224). After the wafer is thinned to a desired thickness (226), the sacrificial layer is decomposed to detach the wafer from the adhesive layer and the substrate (228). The decomposition of the layer may be performed by exposure to heat (or UV light or laser). It is preferred that the exposure of heat (or UV light or laser) only releases or significantly degrades the bonding of the sacrificial layer and wafer but not the bonding of other adhesive bonding, such as the bonding between the adhesive layer and the support substrate.

Figure 13:
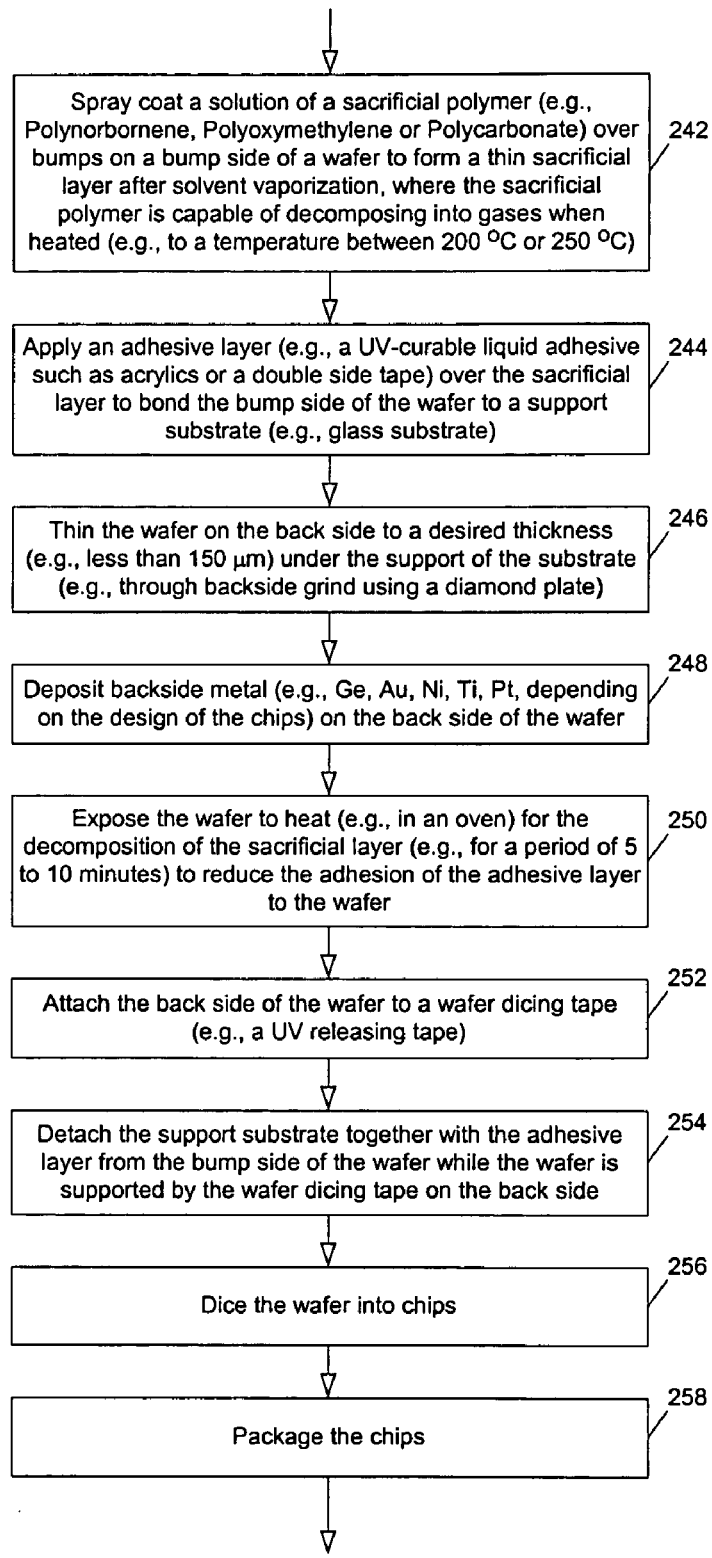
FIG. 13 shows a detailed flowchart for wafer processing according to one embodiment of the invention.

FIG. 13 shows a detailed flowchart for wafer processing according to one embodiment of the invention. A solution of a sacrificial polymer (e.g., Polynorbornene, Polyoxymethylene or Polycarbonate) is spray coated over bumps on a bump side of a wafer to form a thin sacrificial layer after solvent vaporization, where the sacrificial polymer is capable of decomposing into gases when heated (e.g., to a temperature between 200° C. or 250° C.) (242). An adhesive layer (e.g., a UV-curable liquid adhesive such as acrylics or a double side tape) is applied over the sacrificial layer to bond the bump side of the wafer to a support substrate (e.g., glass substrate) (244). For example, after an acrylics layer is spin coated on the bump side of the wafer, a glass substrate is attached over the acrylics layer while it is still in the liquid form. UV-light is then shinned through the glass substrate to cure acrylics in a room temperate. Once the acrylics layer is cured, the wafer is securely bonded to the support substrate. The wafer is then thinned on the backside to a desired thickness (e.g., less than 150 µm) under the support of the substrate (e.g., through backside grind using a diamond plate) (246). After thinning and grinding, backside metal (e.g., Au, Ni, Ti, Pt, depending on the design of the chips) is deposit on the backside of the wafer (248). The wafer is then exposed to heat (e.g., in an oven) for the decomposition of the sacrificial layer (e.g., for a period of 5 to 10 minutes) to reduce the adhesion of the adhesive layer to the wafer (250). After the backside of the wafer is attached to a wafer dicing tape (e.g., a UV releasing tape) (252), the support substrate is detached together with the adhesive layer from the bump side of the wafer while the wafer is supported by the wafer dicing tape on the backside (254). The wafer is diced into chips (256); and the chips are packaged (258).

In the foregoing specification, specific exemplary embodiments have been described. It will be evident that various modifications may be made thereto without departing from the broader spirit and scope of the disclosure. The specification and drawings are, accordingly, to be regarded in an illustrative sense rather than a restrictive sense.

What is claimed is:

1. A method, comprising:
   forming a sacrificial layer on a side of a wafer;
   mounting the wafer onto a substrate over the sacrificial layer;
   processing the wafer; and
   exposing the wafer to heat for a period of time to decompose the sacrificial layer to decouple the wafer and the substrate.

2. The method of claim 1, wherein said sacrificial layer decomposes into gaseous species if heated to a temperature.

3. The method of claim 2, wherein the temperature is in a range between 200 degree Celsius and 250 degree Celsius.

4. The method of claim 2, wherein said sacrificial layer comprises one of: Polynorbornene, Polyoxymethylene and Polycarbonate.

5. The method of claim 1, wherein said forming the sacrificial layer comprises:
   coating a solution of a sacrificial material on the side of the wafer; and
   causing solvent vaporization of the solution of the sacrificial material to form the sacrificial layer.

6. The method of claim 5, wherein the solution of the sacrificial material is spray coated on the side of the wafer.

7. The method of claim 1, wherein the side of the wafer comprises contacts; and the sacrificial layer covers the contacts.

8. The method of claim 7, wherein the contacts comprises bumps; and a thickness of the sacrificial layer is substantially smaller than a height of the bumps.

9. The method of claim 1, wherein said mounting the wafer onto the substrate comprises:
   applying an adhesive layer between the sacrificial layer and the substrate to couple the wafer with the substrate.

10. The method of claim 9, wherein the adhesive layer comprises a double side coated adhesive tape.

11. The method of claim 9, wherein said applying the adhesive layer comprises:
    spin coating a liquid adhesive over the sacrificial layer;
    placing the substrate on the liquid adhesive layer; and
    curing the liquid adhesive to form the adhesive layer.

12. The method of claim 1, wherein said processing the wafer comprises:
    thinning the wafer from a first thickness to a second thickness.

13. The method of claim 12, wherein the second thickness is less than 150 microns.

14. The method of claim 12, wherein said processing the wafer further comprises:
    depositing backside metal (BSM) on the wafer.

15. The method of claim 1, wherein the wafer is exposed to heat in an oven; and the period of time is in a range from 5 minutes to 10 minutes.

16. The method of claim 1, further comprising:
    mounting the wafer on a tape; and
    detaching the substrate together with an adhesive layer from the wafer mounted on the tape;
    wherein the adhesive layer is formed over the sacrificial layer and between the wafer and the substrate to mount the wafer onto the substrate.

17. The method of claim 1, wherein after the substrate is detached from the wafer, the side of the wafer is substantially free of residual traces.

18. The method of claim 1, further comprising:
    plasma cleaning the side of the wafer after the substrate is detached from the wafer.

19. A method, comprising:
    forming a sacrificial layer over bumps on a side of a wafer;
    mounting over the sacrificial layer the side of the wafer onto a substrate;
    thinning the wafer; and
    decoupling the wafer and the substrate by thermally destructing the sacrificial layer.

20. The method of claim 19, wherein said mounting comprises:
    applying an adhesive layer over the sacrificial layer and between the side of the wafer and the substrate.

21. The method of claim 20, wherein when the sacrificial layer is decomposed, adhesion of the adhesive layer between the wafer and the substrate is reduced.

22. The method of claim 21, wherein said thermally destructing the sacrificial layer comprises heating the wafer in an oven.

23. A method, comprising:
    coating a solution of a sacrificial material over bumps on a bump side of a wafer to form a sacrificial layer after solvent vaporization;
    applying an adhesive layer over the sacrificial layer to bond the wafer to a support substrate;
    thinning the wafer supported by the support substrate;

exposing the wafer to heat for decomposition of the sacrificial layer, the decomposition of the sacrificial layer reducing adhesion of the adhesive layer to the wafer;

attaching the wafer, on a side opposite to the bump side of the wafer, to a tape; and detaching the support substrate together with the adhesive layer from the wafer.

24. The method of claim 23, wherein the decomposition of the sacrificial layer causes the adhesion of the adhesive layer to the wafer to be smaller than adhesion of the adhesive layer to the support substrate.

25. The method of claim 24, wherein the sacrificial layer is decomposed into gases when the wafer is exposed the heat; the adhesive layer remains adhering to the wafer after the decomposition of the sacrificial layer; and when the support substrate is detached from the wafer, the bump side of a wafer is substantially free of residue traces from the sacrificial and adhesive layers.

26. The method of claim 23, wherein said applying the adhesive layer comprises:

shinning ultraviolet (UV) light through the support substrate on an adhesive material of a liquid form to cure the adhesive material into a solid form in a room temperature to bond the wafer to the support substrate.

* * * * *